United States Patent
Smith et al.

(10) Patent No.: US 7,379,726 B2
(45) Date of Patent: May 27, 2008

(54) AM DATA RECOVERY CIRCUIT

(75) Inventors: Sterling Smith, Hsinchu (TW); Henry Tin-Hang Yung, Hsinchu (TW)

(73) Assignee: MStar Semiconductor, Inc. (TW)

( * ) Notice: Subject to any disclaimer, the term of this patent is extended or adjusted under 35 U.S.C. 154(b) by 0 days.

(21) Appl. No.: 11/779,666

(22) Filed: Jul. 18, 2007

(65) Prior Publication Data
US 2007/0252572 A1 Nov. 1, 2007

Related U.S. Application Data

(60) Continuation of application No. 11/001,133, filed on Dec. 2, 2004, now Pat. No. 7,274,921, which is a division of application No. 10/409,125, filed on Apr. 9, 2003, now Pat. No. 6,841,981.

(60) Provisional application No. 60/371,363, filed on Apr. 9, 2002.

(51) Int. Cl.
  *H04B 1/26* (2006.01)
  *G05F 3/04* (2006.01)
(52) U.S. Cl. .................................. 455/313
(58) Field of Classification Search ............. 455/227, 455/229, 254, 280, 284, 287, 291, 293, 313, 455/314, 323, 325, 333, 337, 343.1; 323/312, 323/313, 315
See application file for complete search history.

(56) References Cited

U.S. PATENT DOCUMENTS

| | | | |
|---|---|---|---|
| 3,735,287 A | 5/1973 | Lowe | |
| 4,763,076 A | 8/1988 | Arakawa et al. | |
| 5,625,544 A | 4/1997 | Kowshik et al. | |
| 5,974,078 A * | 10/1999 | Tuttle et al. | 375/130 |
| 6,023,188 A | 2/2000 | Lee et al. | |
| 6,094,161 A | 7/2000 | Cassen et al. | |
| 6,184,741 B1 | 2/2001 | Ghilardelli et al. | |
| 6,295,445 B1 | 9/2001 | Uesugi | |
| 6,411,199 B1 * | 6/2002 | Geiszler et al. | 340/10.1 |
| 6,516,185 B1 | 2/2003 | MacNally | |
| 6,516,187 B1 | 2/2003 | Williams et al. | |
| 6,549,064 B2 | 4/2003 | Bandy et al. | |
| 6,583,664 B2 | 6/2003 | Mathe et al. | |
| 6,670,844 B2 | 12/2003 | Kobayashi et al. | |
| 6,674,317 B1 | 1/2004 | Chou | |
| 6,736,474 B1 | 5/2004 | Tiede | |

(Continued)

*Primary Examiner*—Matthew V. Nguyen
(74) *Attorney, Agent, or Firm*—Michael Bednarek; Paul, Hastings, Janofsky & Walker LLP

(57) ABSTRACT

The present invention provides a passive RFID chip with on-chip charge pumps for generating electrical power for the chip from radio frequencies. The passive RFID chip comprises an analog portion and a digital portion. The analog portion primarily comprises a voltage sensor and an AM data detector. The digital portion comprises a state machine digital logic controller. Incoming RF signals enter the chip via external antennas. The RF signals are converted into regulated DC signals by RF-DC converters with the voltage sensor. The RF-DC converters provide power for all the on-chip components and hence the chip does not require external power supply. The incoming RF signals are demodulated by demodulators and enter the AM data detector where the envelope transitions are detected. A voltage alarm is provided to ensure the voltage level does not drop below an operational level of the chip. The logic signals and programming data are controlled by the state machine digital logic controller and the timing signals are provided by an on-chip oscillator.

6 Claims, 9 Drawing Sheets

U.S. PATENT DOCUMENTS

| | | |
|---|---|---|
| 6,946,847 B2 | 9/2005 | Nishimori et al. |
| 7,088,246 B2 * | 8/2006 | Fukuoka .................. 340/572.5 |
| 2002/0149480 A1 | 10/2002 | Shanks et al. |
| 2002/0149481 A1 | 10/2002 | Shanks et al. |
| 2002/0149483 A1 | 10/2002 | Shanks et al. |
| 2002/0152044 A1 | 10/2002 | Shanks et al. |
| 2002/0167405 A1 | 11/2002 | Shanks et al. |

* cited by examiner

AM DATA RECOVERY CIRCUIT

CROSS-REFERENCE TO RELATED APPLICATION

This application is a continuation of U.S. patent application Ser. No. 11/001,133 filed Dec. 2, 2004, now U.S. Pat. No. 7,274,921 which is a divisional of U.S. patent application Ser. No. 10/409,125, filed Apr. 9, 2003, now U.S. Pat. No. 6,841,981, which claims the priority benefits of U.S. provisional application entitled "RADIO FREQUENCY DATA COMMUNICATION DEVICE IN CMOS PROCESS:" filed on Apr. 9, 2002, Ser. No. 60/371,363. All disclosures of this application are incorporated herein by reference.

BACKGROUND OF THE INVENTION

1. Field of the Invention

The present invention generally relates to a radio frequency identification (RFID) chip, and more particularly, to an REID chip using CMOS technology.

2. Description of Related Arts

In goods-related or services-related industries, it is necessary to inventory the item stock every while. Conventionally manual labors have been employed to count the items located on the shelf; and those are otherwise located in the store or warehouse for a long time. For the purpose of easing off such time-consuming and labor-intensive jobs, a technology known as radio frequency identification (RFID) is provided to have the ability to monitor the items that are located within a particular range.

Based upon the RFID technology, RFID chips are affixed to each item to be monitored. The presence of the RFID chip, and therefore the item to which the chip is affixed, may be checked and monitored by devices known as RF readers. The RF reader may monitor the existence and location of the items having chips affixed thereto through wireless interrogations. Typically, each chip has a unique identification number that the RF reader uses to identify the particular chip and item. To efficiently avoid collisions between signals transmitted by the RFID chips, the interrogation protocol, such as the binary traversal protocol, may be employed to exchange the signals between the RF readers and the RFID chips. Examples of such binary traversal protocol is described in U.S. Patent Application Publication Numbers 20020167405A1, 20020152044A1, 20020149483A1, 20020149482A1, 2002014948A1, 20020149480A1, and 20020149416A1, all of which are incorporated herein by reference.

Because a great many items may need to be monitored, many chips may be required to track the items. Hence, the cost of each RFD chip needs to be minimized. However, current available RFD chips configured with extenal batteries are expensive. For the foregoing reasons, there is a need for passive RFID chips with implementation without external batteries, which are inexpensive and small while the read range thereof is satisfactory.

SUMMARY OF THE INVENTION

The present invention is directed to a RF data communication device that can be manufactured in the mature CMOS process and applied to passive RFID chips so as to minimize the cost while the read range thereof is satisfactory.

To achieve the above object, the present invention provides a self-regulated power supply having a RF-DC converter, a voltage sensor, and a shunt element. The RF-DC converter is used to convert an RF signal at an input node to a power signal at an output node. The voltage sensor is used to monitor the power signal to generate a control signal. The shunt element connected to the input node to attenuate the RF signal in response to the control signal. The voltage sensor drives the control signal at a first slew rate and a second slew rate while the second slew rate is greater than the first slew rate.

In addition, the present invention provides an AM data recovery circuit having a demodulator, a low pass filter, a comparator, a reset and a switch. The demodulator is used to convert an incoming RF signal at an input node to a base-band signal at an output node. The low pass filter is utilized to generate a reference signal that follows and approaches the base-band signal with a time constant. The comparator is used to compare the base-band signal and the reference signal so as to generate a digital data signal. The reset generates a reset signal in response to transitions of the digital data signal. The switch is used to reset the reference signal in response to the reset signal.

Moreover, the present invention provides an AM data recovery circuit having a demodulator and a current-mode data detector. The demodulator is used for converting an incoming RF signal at an input node to a voltage signal at an output node and a current-mode data detector The current-mode data detector is used for converting the voltage signal into a current source, the current-mode data detector having a current output proportional to the power at the output node of the demodulator such that a demodulated signal can be generated.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1:
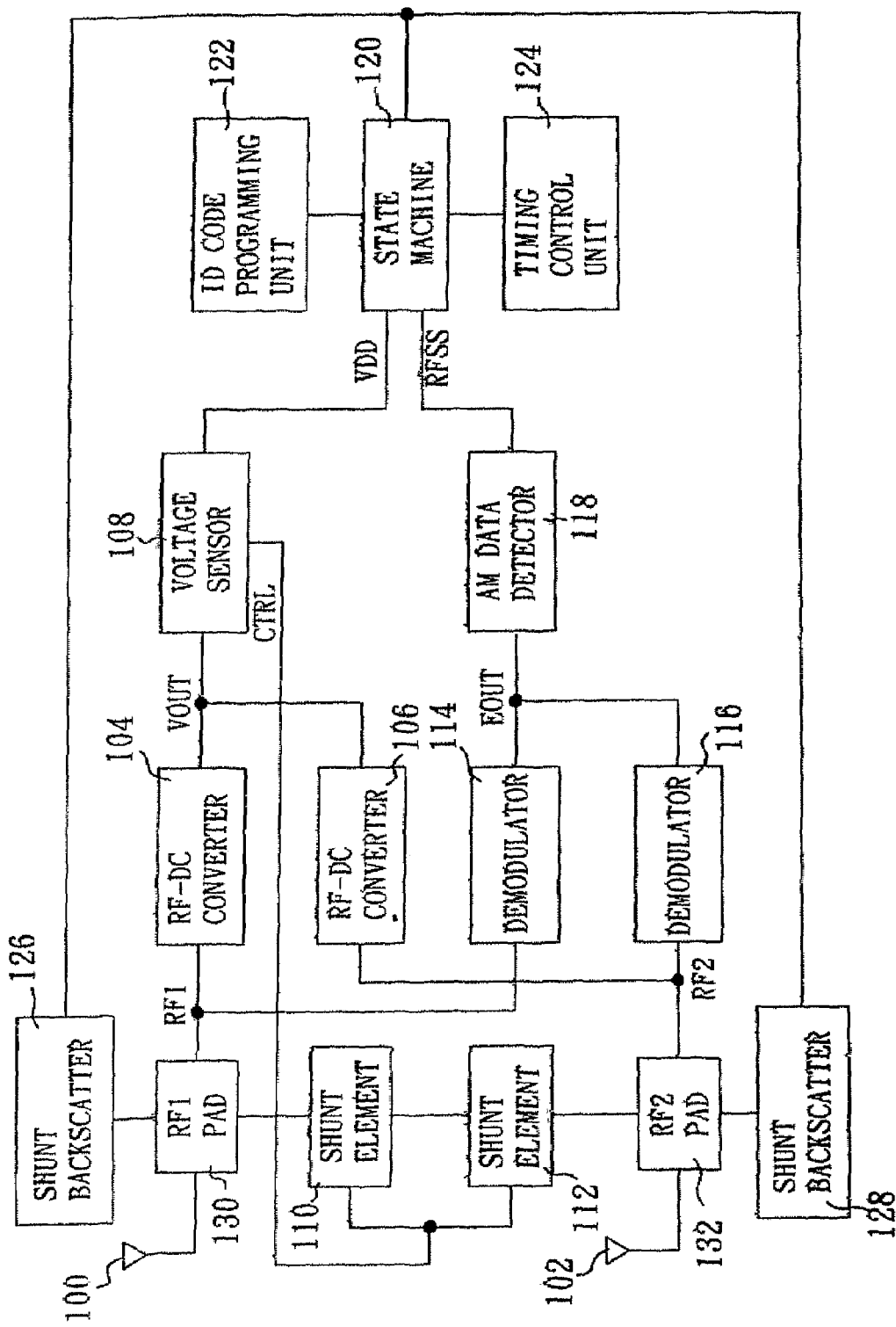
FIG. 1 depicts a block diagram of a passive RFID chip in accordance with the present invention.

Referring to FIG. 1, a block diagram of a passive RFID chip in accordance with the present invention is schematically illustrated. The term "passive" means that the RFID chip is provided with on-chip RF-DC converters for generating the required electrical power for the chip from incoming RE energy. The passive RFID chip of the present invention is provided with a first pad 130 and a second pad 132 operatively connected to a first antenna 100 and a second antenna 102 for receiving RF signals RF1 and RF2, respectively. The first antenna 100 and the second antenna 102 are so arranged that the average gain over all orientations is increased with respect to each antenna separately. Preferably dipole antenna designs which the first antenna 100 would be oriented at a 90 degree angle with respect to the second antenna 102 on the same plane.

The passive RFID chip of the present invention can be categorized to an analog portion and a digital portion. As shown in FIG. 1, the analog portion is primarily directed to a pair of RF-DC converters 104 and 106, a voltage sensor 108, another pair of demodulators 114 and 116, an AM data detector 118. The digital portion comprises a state machine digital logic controller 120 and an ID code programming unit 122. The incoming RF signals RF1 and RF2 are applied to the RF-DC converters 104 and 106. Because the first antenna 100 and the second antenna 102 have different orientations, one of the RF-DC converters 104 and 106 may pick up much more RF energy than the other one depending upon the incoming RF signals RF1 and RF2. Therefore, the voltage sensor 108 powered by a supply voltage VOUT is essentially powered by one of the RF-DC converters 104 and 106. In order to avoid the weaker RF-DC converter from draining the supply voltage VOUT, a backflow prevention scheme is incorporated in the RF-DC converter designs in order to allow the weaker RF-DC converter to be essentially disconnected from the VOUT power node. Further details regarding the implementations of the RF-DC converters 104 and 106 will be described below.

The energy of RF signals RF1 and RF2 is converted into a DC voltage VDD by the RF-DC converters 104 and 106 and the voltage sensor 108. The DC voltage VDD provides power for all the on-chip components and hence the chip does not require external power supply. Powered by the DC voltage VDD, the state machine is employed to control the logic signals and programming data while the timing signals are provided by the timing control unit 124. As an example, the timing control unit 124 has an on-chip oscillator for power concern. Moreover, the voltage sensor 108 generates a control signal CTRL to control the shunt elements 110 and 112. The shunt elements 110 and 112 are turned on in response to the control signal CTRL for attenuating the incoming RF signals RF1 and RF2, thus forming a negative feedback loop to regulate the supply voltage VDD. When the feedback loop is activated, the voltage sensor 108 can be used to stabilize the supply voltage VDD.

In addition, the incoming RF signals RF1 and RF2 are demodulated by the demodulators 114 and 116 where the envelope transitions are detected. The detailed circuit of the demodulators 114 and 116 may be similar to that of the RF-DC converters 104 and 106 except of the size or, more specifically, the device aspect ratio. According to the present invention, the size of the RF-DC converters 104 and 106 is greater than that of the demodulators 114 and 116. Because the first antenna 100 and the second antenna 102 have different orientations, one of the demodulators 114 and 116 may pick up much more RF energy than the other one depending upon the incoming RF signals RF1 and RF2. Therefore, the AM data detector 118 receives an envelope voltage EOUT is essentially powered by one of the demodulators 114 and 116. Similarly the backflow prevention scheme can be incorporated in the charge pump designs in order to allow the weaker charge pump to be essentially disconnected from the EOUT signal node. Further details regarding the implementations of the demodulators 114 and 116 will be described below.

The demodulators 114 and 116 generate a base-band signal EOUT proportional to the amplitude of the RF signals RF1 and RF2. The signal EOUT goes through the AM data detector 118 to generate data signal RFSS. The state machine 120 in response to the data signal RFSS accesses the ID code programming unit 122 to determine whether a logical "1" or "0" is to be transmitted by the RFID chip. More specifically, the state machine 120 accesses one or more bits of the ID code stored in the ID code programming unit 122. The accessed bits of the ID code are transmitted to the shunt backscatters 126 and 128 to optionally perform backscatter modulation at the selected frequency in response to RFSS signals. Then, the modulated signals generated by the shunt backscatters 126 and 128 are provided by the respective antennas 100 and 102 in the form of backscatter energy.

Self-Related Power Supply

Figure 2:
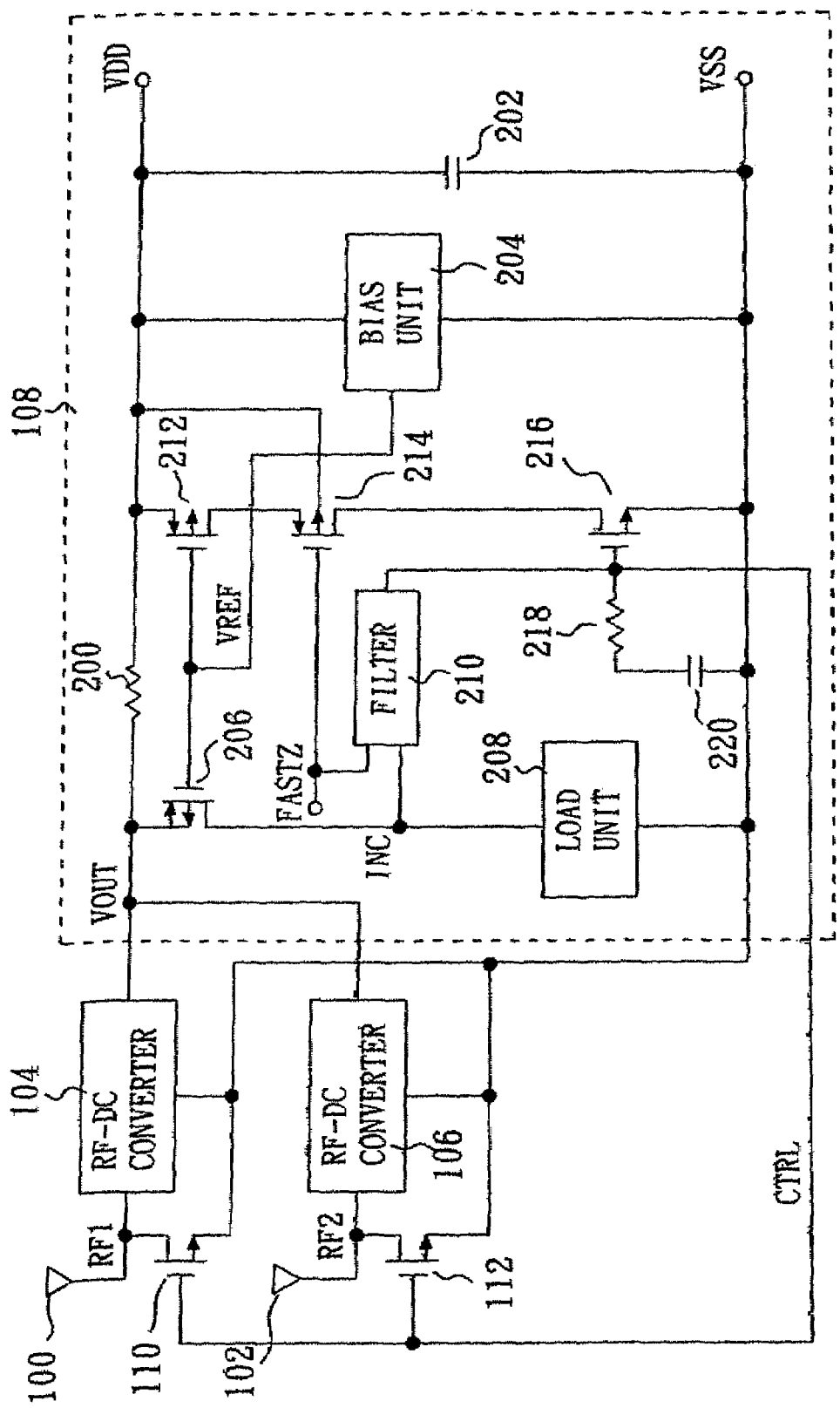
FIG. 2 depicts a schematic diagram of a self-regulated power supply in accordance with the present invention.

Referring to FIG. 2, a schematic diagram of a self-regulated power supply in accordance with the present invention is illustrated. In FIG. 2, the self-regulated power supply of the present invention comprise the RF-DC converters 104 and 106, the shunt elements 110 and 112, and the voltage sensor 108. The incoming RF signals RF1 and RF2 enter the self-regulated power supply through the antennas 100 and 102. More specifically, the RF-DC converters 104 and 106 receive the RF signals RF1 and RF2 from the first antenna 100 and the second antenna 102 respectively, and then convert the RF signals RF1 and RF2 into DC voltage VOUT. Because the RF signals RF1 and RF2 are received by the antennas 100 and 102 with different orientations, one RF-DC converter may pick up much more signal than the other one. Accordingly, the VOUT node is essentially powered by one of the RF-DC converters 104 and 106. In order to avoid the weaker RF-DC converter from draining supply at the VOUT node, the backflow prevention scheme is incorporated in the RF-DC converter designs in order to allow the weaker RF-DC converter to be essentially disconnected from the VOUT node. Further details regarding the implementations of the RF-DC converters 104 and 106 will be described below.

As shown in FIG. 2, the voltage sensor 108 generates DC-regulated voltage VDD by using a low pass filter to filter out high frequency components of the supply VOUT. The low pass filter comprises a resistor 200 connected between the VOUT node and the VDD node, and a capacitor 202 connected between the VDD node and a VSS node that is usually a ground node. A bias unit 204 connected between the VDD node and the VSS node provides a reference voltage VREF, which is relatively independent of the voltage at the VDD node. A p-channel MOS transistor 206 is configured with a gate connected to the VREF node, a source and a bulk tied together to the VOUT node, and a drain, entitled an INC node, connected to a load unit 208. The load unit 208 connected between the INC node and the VSS node provides load impedance for the p-channel MOS transistor 206. Because the bias unit 204 provides the reference voltage VREF relatively independent of VDD, the p-channel MOS transistor 206 will be turned on hard enough to allow the INC node to rise when the voltage at the VDD node rises higher and higher. The voltage at the INC node is an input of a filter 210. The filter 210 has an output CTRL used to control the shunt elements 110 and 112. In FIG. 2, the shunt elements 110 and 112 are implemented by n-channel MOS transistors. Accordingly, the n-channel MOS transistor 110 is configured with a gate connected to the CRTL node, a drain tied to the RF1 node, and a source connected to the VSS node, while the n-channel MOS transistor 112 is configured with a gate connected to the CTRL node, a drain tied to the RF2 node, and a source connected to the VSS node. When asserted, the n-channel MOS transistors 110 and 112 will attenuate the incoming RF signals RF1 and RF2, thus forming a negative feedback loop to regulate the supply VDD. A resistor 218 and a capacitor 220 are connected in series between the CTRL node and VSS node on account of stability concern and time constant control. The capacitor 220 can be implemented by means of a MOS capacitor. In addition, the filter has another input connected to an FASTZ node at which a FASTZ signal is asserted by the state machine 120 when a higher slew rate is required. Further details regarding the implementations of the filter 210 will be described below.

Moreover, the voltage sensor 108 has an over-voltage shunt unit connected between the VDD node and the VSS node. The over-voltage shunt unit is provided with two p-channel MOS transistors 212-214 and an n-channel MOS transistor 216. The p-channel MOS transistor 212 is configured with a source and a bulk tied together to the VDD node, a gate connected to the VREF node, and a drain connected to a source of the p-channel MOS transistor 214. The p-channel MOS transistor 214 is configured with a gate connected to the FASTZ node, a bulk connected to the VDD node, and a drain tied to a drain of the n-channel MOS transistor 216. Furthermore, the n-channel MOS transistor 216 is provided with a gate tied to the CTRL node, and a source connected to the VSS node. The over-voltage shunt unit is provided for clamping when the voltage at the VDD node exceeds a predetermined level. When the p-channel MOS transistor 214 is turned on by the asserted FASTZ signal, the n-channel MOS transistor 216 can be activated and turned on by the CTRL signal to promptly clamp the voltage at the VDD node.

Figure 3:
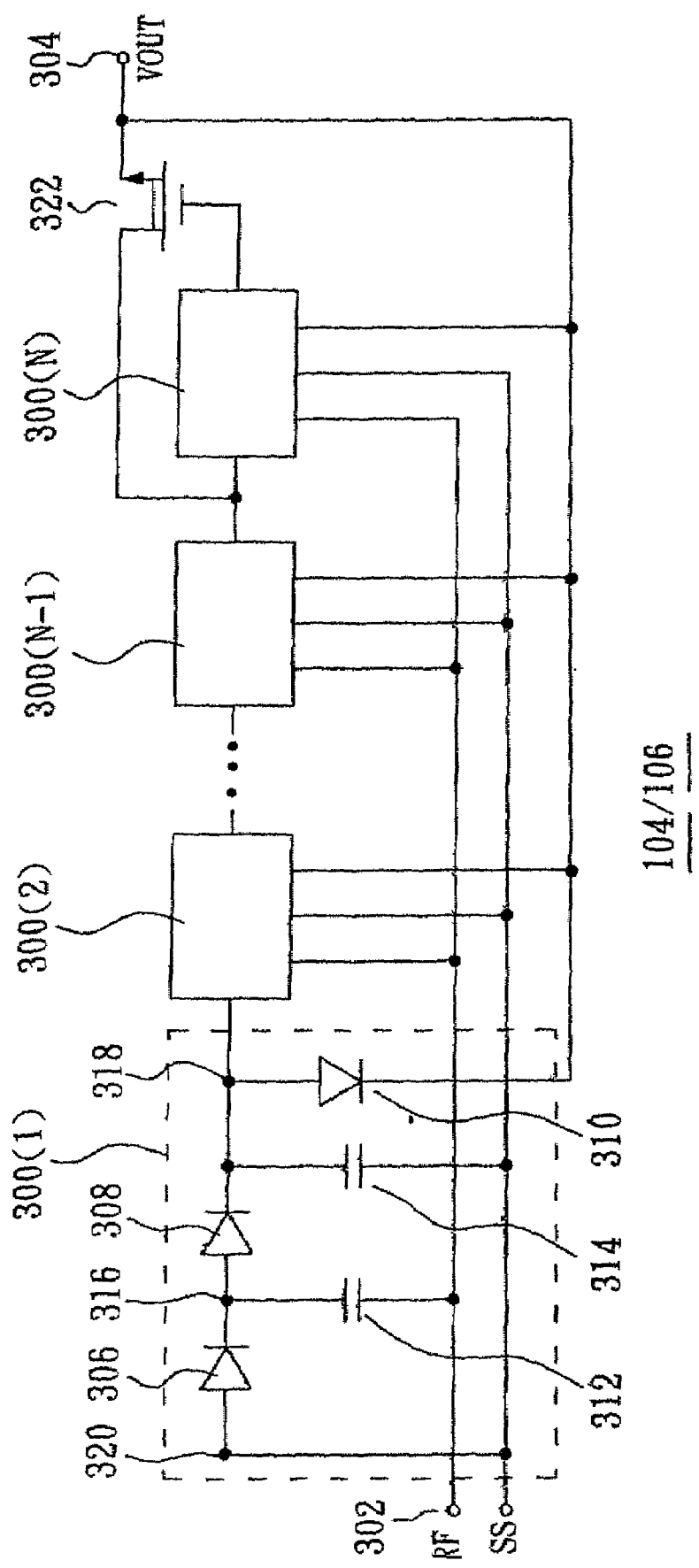
FIG. 3 depicts a circuit diagram of the RE-DC converter 104 or 106 in accordance with the present invention.

FIG. 3 illustrates a circuit diagram of the RF-DC converter 104 or 106 in accordance with the present invention. The RF-DC converter 104/106 rectifies the RF signal received at an input node 302, increases the voltage amplitude, and generates the output DC voltage VOUT at an output node 304. The output voltage VOUT is sufficiently stable that it can be used as a voltage supply for the rest of the chip. More specifically, once a steady state voltage is reached, further increases in the power level of the RF signal produce smaller increases the output DC voltage VOUT. This occurs because the efficiency of the RF-DC converter 104/106 is designed to intentionally decrease once the RE signal reaches a threshold power level.

The RF-DC converter 104/106 includes multiple stages 300(1), 300(2), . . . , 300(N-1) and 300(N). Any number of stages 300 could be utilized, and some stages are shown in FIG. 3 for convenience of discussion only. Each stage 300 includes three diodes 306-310 and two capacitors 312 and 314. The capacitor 312 in each stage 300 is connected between a central terminal 316 and to the input node 302 so that each stage 300 simultaneously receives the RF input signal received at the input node 302. The capacitor 314 in each stage 300 is connected between an output terminal 318 and the VSS node. The diode 306 in each stage 300 is connected between an input terminal 320 and the central terminal 316. More specifically, the anode of the diode 306 is connected to the output terminal 318 in the prior stage 300 (except for the first stage 300(1) where the anode of diode 320 is connected directly to the VSS node), and the cathode of the diode 306 is connected to the central terminal 316. The diode 308 in each stage 300 is connected between the central terminal 316 and the output terminal 318, which connects to the following or adjacent stage 300 (except for the last stage 300(N) where the cathode of diode 308 is connected directly to a gate of a switch 322). More specifically, the anode of the diode 308 is connected to the central terminal 316, and the cathode of the diode 308 is connected to the output terminal 318. The diode 310 in each stage 300 is connected between the output terminal 318 and the VOUT node 304. More specifically, the anode of the diode 310 is connected to the output terminal 318, and the cathode of the diode 310 is connected to the VOUT node 304.

Figure 4:
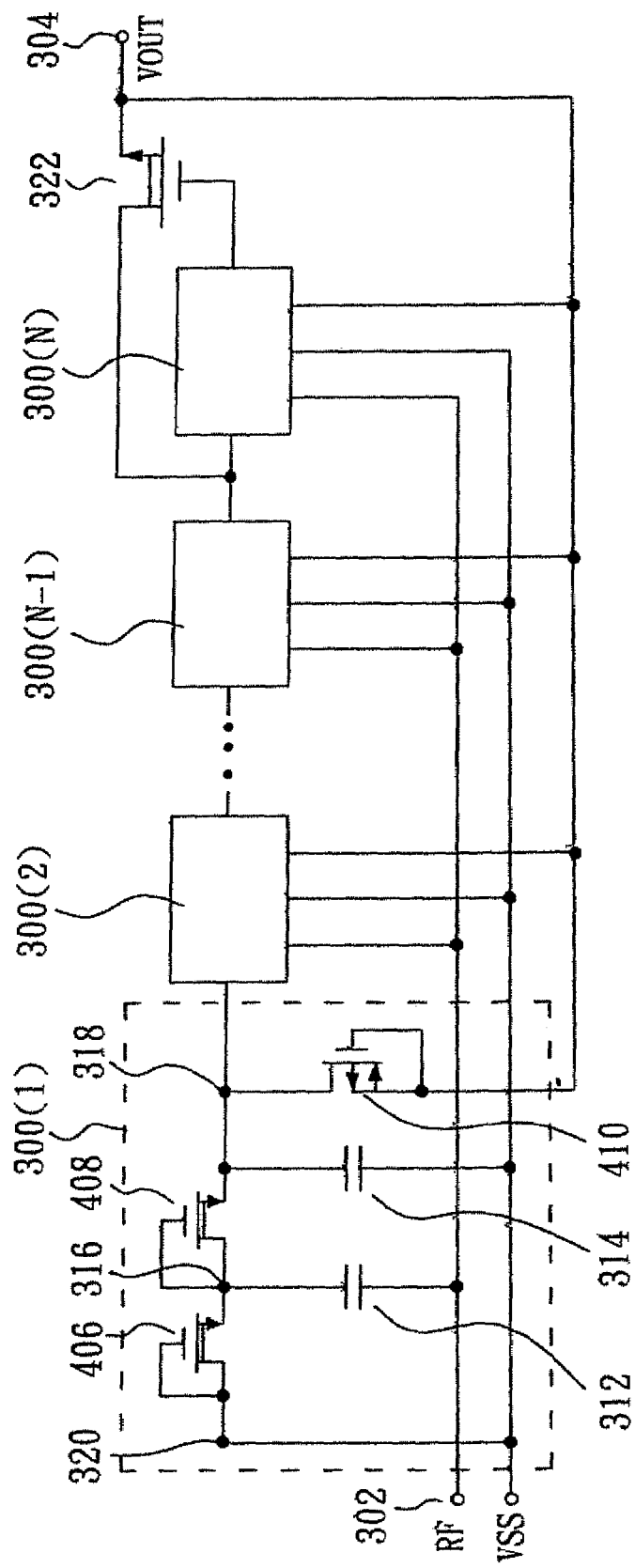
FIG. 4 depicts another circuit diagram of the RF-DC converter 104 or 106 in accordance with the present invention.

As shown in FIG. 4, the diodes 306-308 can be implemented by using diode-connected MOSFET devices 406-408 that approximate the operation of a diode. The diode 310 can be implemented by the p/n junction of a p-channel MOS transistor 410 for better clamping while n-well/p-sub manufacturing process is utilized. For the purpose of conducting at a lower RF signal level, the diode-connected MOSFET devices 406 and 408 for implementing the diodes 306 and 308 can be provided with low threshold voltages |VT|<0.2V so as to increase the conductivity of the configured diode structures. The low threshold transistors 406 and 408 can simplify the circuit design and make the RFID chip capable of generating sufficient power with low voltage RF inputs at 150 uW peak. In addition, the capacitors 312 and 314 can be implemented by means of metal-insulator-metal (MIM) capacitors with low parasitic bottom plate to reduce capacitance seen by the RF input node 302, where Cp (parasitic bottom plate capacitance)<0.04 Crf (capacitance of MIM capacitor 314).

The operation of the RF-DC converter 104/106 is as follows. The RF signal is simultaneously applied to each stage 300 through the capacitor 312. During a positive cycle of the RF signal, the capacitor 312 in each stage 300 transfers charge to the central terminal 316. The diode 308 is forward biased by the charge on the central terminal 316, causing the diode 308 to conduct and transfer the charge from the central terminal 316 to the output terminal 318. The charge on the output terminal 318 is stored on the capacitor 314 until the next positive RF cycle. The diode 306 is reversed biased during the positive cycle and therefore does not conduct any charge. During the negative cycle of the RF signal, the diode 306 is forward biased and conducts charge from the output terminal 320 in one stage 300 to the central terminal 316 in an adjacent stage 300 (except for the first stage 300(1) which also transfers charge from VSS node to the central terminal 316). The diodes 308 are reversed biased and do not conduct any charge. During the next positive cycle, the diode 308 is again forward biased, moving charge from the central terminal 316 to the output terminal 318 within each stage. The charge that is moved from the central terminal 316 to the output terminal 318 includes both the charge accumulated on the central terminal 316 during the positive cycle, but also the charge accumulated on the central terminal 316 from the negative cycle. Over multiple cycles of the RF signal, charge accumulates and increases as moves it through the stages 300(1)-300(N), and the corresponding voltage is added in-series at the capacitors 314. The accumulated charge at the output terminals 318 of the stages 300(N-1) and 300(N) is converted to a DC voltage $V_{DD}$ by their capacitors 314.

Moreover, the present invention uses the diode 310 in each stage 300 connected between the output terminal 318 and the VOUT node 304 to keep charge pump voltage from exceeding reliability limitations of MOSFET transistors 406 and 408 when RF input power is too high. As an example, if the voltage at the output terminal 318 exceeds that at the VOUT node 304 by around 0.6V, the current will flow from the output terminal 318 to the VOUT node 304 for preventing the capacitor 314 from charging to a voltage which is too high for the diode-connected transistor 408. Moreover, the present invention uses the switch 322 for final stage output to prevent charge on the VOUT node 304 from draining back out in reverse when one charge pump is relatively weaker than the other charge pump when the RF input energy is relatively low. The switch 322 can be implemented by means an n-channel MOS transistor with a low threshold voltage. The n-channel MOS transistor 322 is configured with a drain connected to the output terminal 318 of the stage 300(N-1), a gate connected to the output terminal 318 of the stage 300(N), and a source connected to the VOUT node 304.

Figure 5:
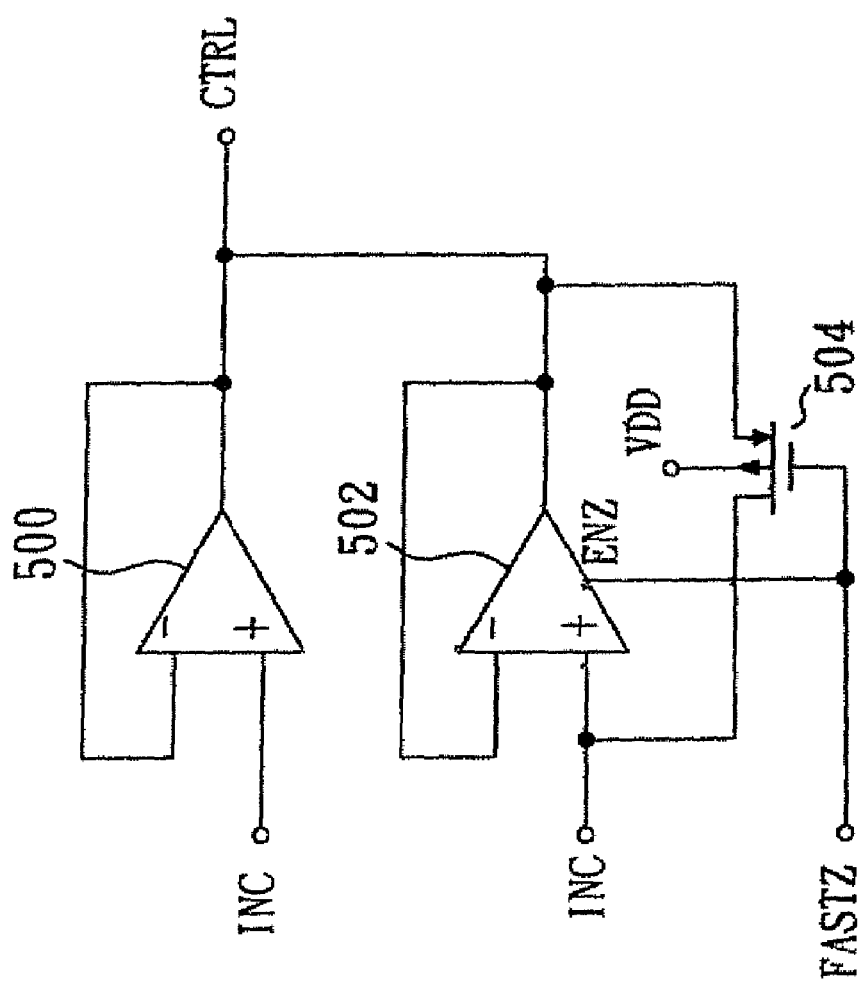
FIG. 5 depicts a schematic diagram of the filter 210 in accordance with the present invention.

FIG. 5 illustrates a schematic diagram of the filter 210 in accordance with the present invention. The filter 210 has two unit-gain buffers 500-502 and a p-channel MOS transistor 504. The unit-gain buffer 500 is provided with a non-inverting input connected to the INC node, an inverting input and an output tied together to the CTRL node. Similarly, the unit-gain buffer 502 is provided with a non-inverting input connected to the INC node, an inverting input and an output tied together to the CTRL node. Furthermore, the buffer 502 is provided with an enable input ENZ connected to the FASTZ node, whereby being turned off when FASTZ is logically high or turned on when FASTZ is logically low. The p-channel MOS transistor 504 is configured with a drain connected to the INC node, a source connected to the CTRL node, a bulk connected to the VDD node, and a gate controlled by the FASTZ signal.

According to the present invention, the buffer 502 is provided with a driving speed higher than that of the buffer 500. The higher speed buffer 502 means a device with higher slew rate, greater bandwidth, higher driving current, higher driving capability, or the like. The FASTZ signal keeps unasserted, logically-high, when the passive RF chip operates at a normal drive mode at which the VDD supply power keeps track of the incoming RF energy smoothly. The buffer 502 and the p-channel MOS transistor 504 are turned off in response to the unasserted FASTZ signal. However, the FASTZ signal will be asserted, for example, to logically low state by the state machine 120, when high speed drive mode is required. Thus, the buffer 502 and the p-channel MOS transistor 504 will be simultaneously turned on in response to the asserted FASTZ signal so as to provide higher drive capability.

AM Data Recovery Circuit

Figure 6:
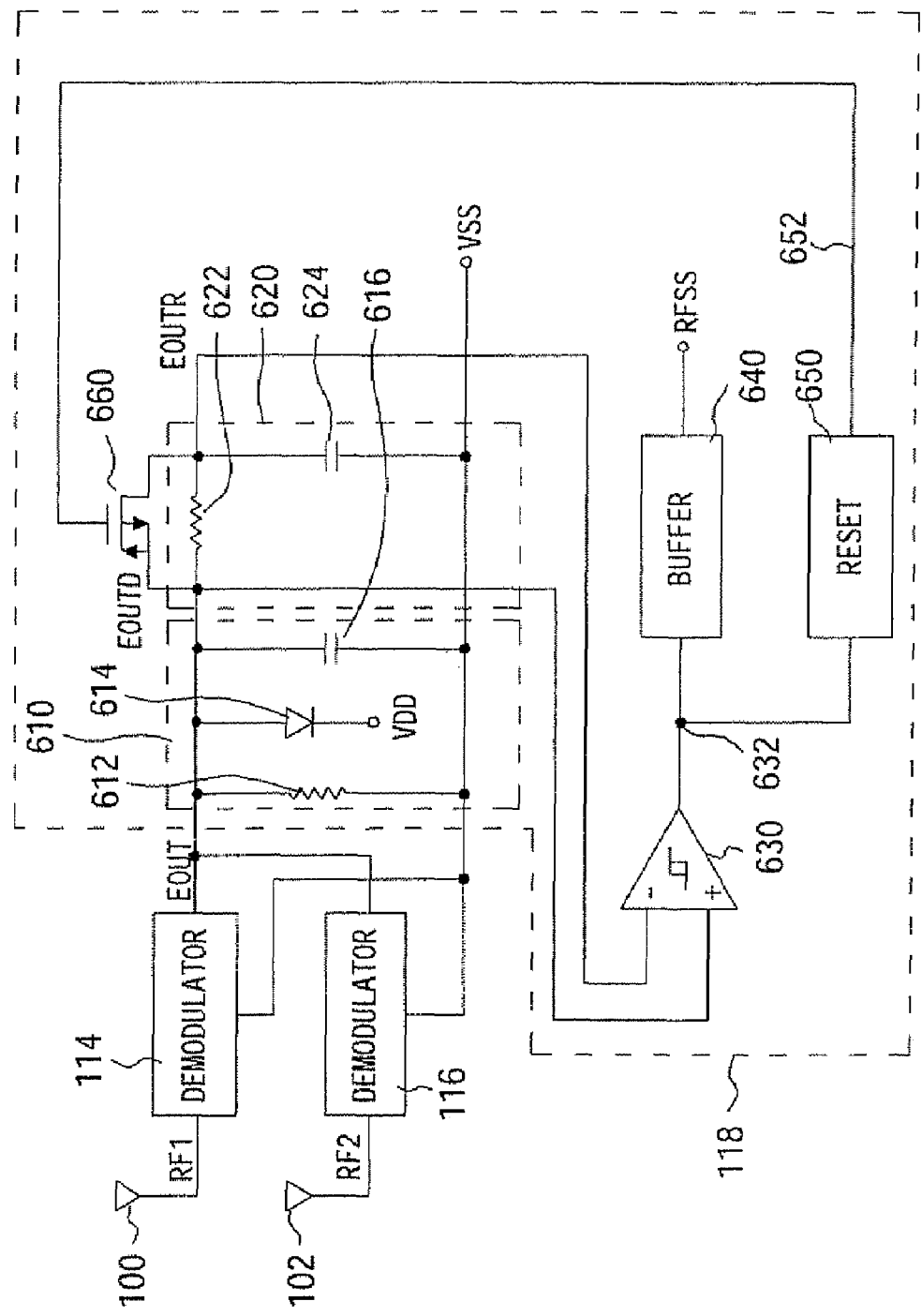
FIG. 6 depicts a schematic diagram of an amplitude-modulated (AM) data recovery circuit in accordance with the present invention.

Referring to FIG. 6, a schematic diagram of an amplitude-modulated (AM) data recovery circuit in accordance with the present invention is illustrated, in FIG. 6, the AM data recovery circuit of the present invention comprise the demodulators 114 and 116, and the AM data detector 118. The incoming RF signals RF1 and RF2 enter the AM data recovery circuit through the antennas 100 and 102. More specifically, the demodulators 114 and 116 receive the RF signals RF1 and RF2 from the first antenna 100 and the second antenna 102 respectively, and then demodulate the RF signals RF1 and RF2 into a base-band signal EOUT. Because the RF signals RF1 and RF2 are received by the antennas 100 and 102 with different orientations, one demodulator may pick up much more signal than the other one. Accordingly, the EOUT node is essentially powered by one of the demodulators 114 and 116. In order to avoid the weaker demodulator from draining base-band signal energy at the EOUT node, the backflow prevention scheme is incorporated in the demodulator designs in order to allow the weaker demodulator to be essentially disconnected from the EOUT node. Further details regarding the implementations of the demodulators 114 and 116 will be described below.

As shown in FIG. 6, the data detector 118 includes: an interface unit 610 having a resistor 612, a diode 614 and capacitor 616; a low pass filter 620 having a resistor 622 and a capacitor 624; a comparator 630; a buffer 640; a reset unit 650; and a switch 660. The interface unit 610 is configured with the resistor 612, connected between the EOUT node and the VSS node, to provide a load for the demodulators 114 and 116, while the capacitor 616 connected between the EOUT node and the VSS node is employed to remove high frequency components of the EOUT signal. However, the diode 614 is configured with an anode connected to the EOUT node and a cathode connected to the VDD node to provide over-voltage protection. The resistor 612 and the diode 614 can be implemented by MOS transistors. In a word, the EOUT signal is converted by the interface unit 210 to another base-band signal EOUTD.

The EOUTM signal goes through a low pass filter 620 formed by the resistor 622 and the capacitor 624 to generate a reference signal EOUTR which keeps slower track of the base-band signal EOUTD. The two signals EOUTD and EOUTR are applied at a non-inverting node and an inverting node of the comparator 630 respectively. When there is a transition from a "1" to a "0" in the demodulated signal EOUTD, the EOUTR signal generally follows and approaches the demodulated signal EOUTD but with a much longer time constant provided by the low pass filter 620. Therefore, the demodulated signal EOUTD falls below the reference signal EOUTR so that the comparator 630 can detect the falling transition in the demodulated signal EOUTD. When there is a transition from a "0" to a "1" in the demodulated signal EOUTD, the EOUTR signal generally follows and approaches the demodulated signal EOUTD but with a much longer time constant provided by the low pass filter 620. Therefore, the demodulated signal EOUTD rises above the reference signal EOUTR so that the comparator 630 can detect the rising transition in the demodulated signal EOUTD. In a word, the comparator 630 is employed to compare the amplitude of the demodulated signal EOUTD with that of the reference signal EOUTR, and generates digital output signal 632 that is representative of the comparison. The digital signal 632 goes through the buffer 640 to generate the data signal RFSS for the state machine 120.

The reset unit 650 is connected to the output of the comparator 630 to receive the digital output signal 632. The reset unit 650 generate a control signal 652 when the transition from a "0" to a "1" or from a "1" to a "0" in the digital output signal 632. The switch 660 is therefore turned on to short the EOUTD and EOUTR nodes so as to temporarily reset the reference signal EOUTR equal to the demodulated signal EOUTD.

Preferably, the comparator 630 has some hysteresis to insure sufficient separation between the EOUTD and EOUTR signals so that a proper comparison can be made. For example, the hysteresis can be implemented by skewing the sizes of the input transistors in the differential inputs of the comparator 630. For example, the hystersis offset can be set to approximately tenths of millivolts so as to insure sufficient separation between the demodulated signal EOUTD and the reference signal EOUTR.

Figure 7:
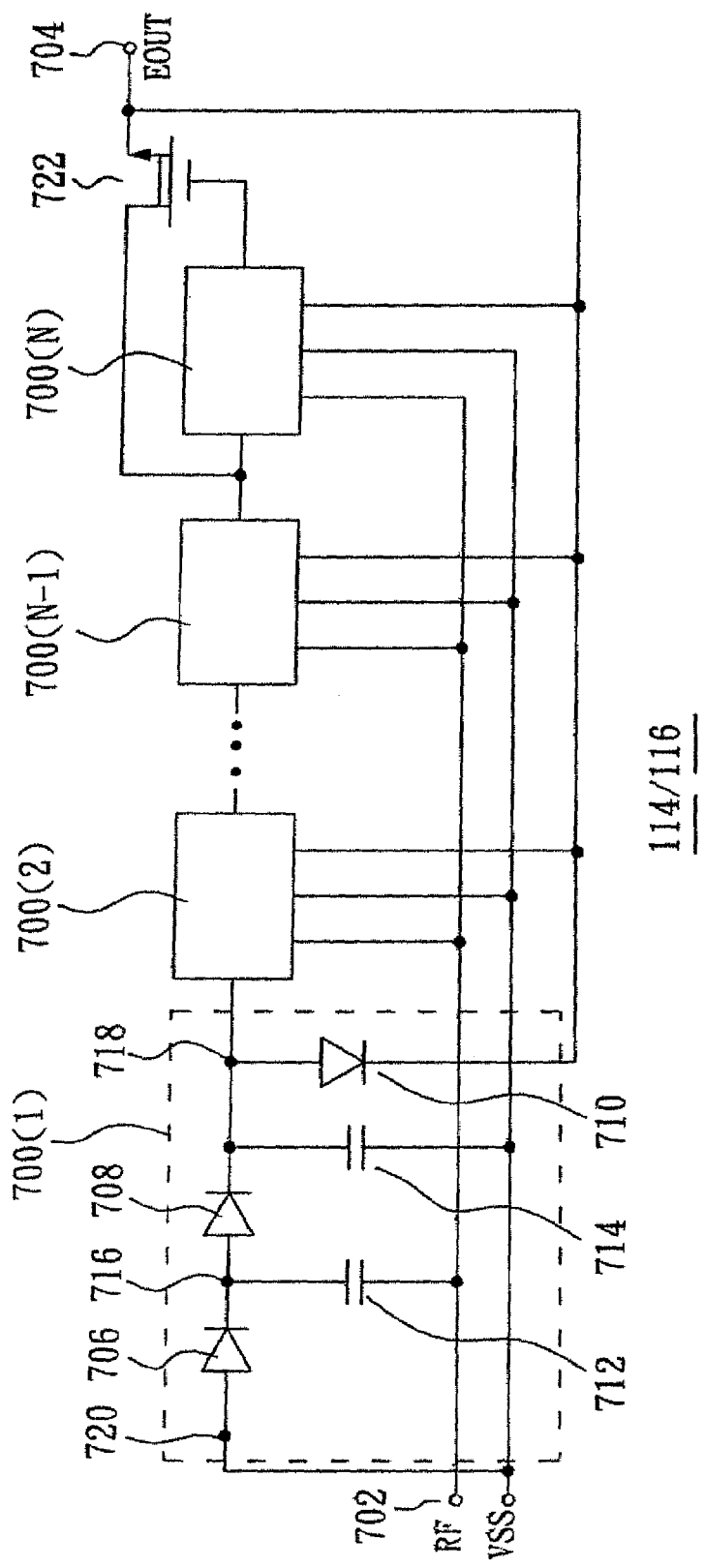
FIG. 7 depicts a circuit diagram of the demodulator 114 or 116 in accordance with the present invention.

FIG. 7 illustrates a circuit diagram of the demodulator 114 or 116 in accordance with the present invention. The demodulator 114/116 will generate the base-band signal EOUT proportional to the amplitude of the RF signal. The demodulator 104/106 includes multiple stages 700(1), 700(2), ..., 700(N-1) and 700(N). Any number of stages 700 could be utilized, and some stages are shown in FIG. 7 for convenience of discussion only. Each stage 700 includes three diodes 706-710 and two capacitors 712 and 714. The capacitor 712 in each stage 700 is connected between a central terminal 716 and to the input node 702 so that each stage 700 simultaneously receives the RF input signal received at the input node 702. The capacitor 714 in each stage 700 is connected between an output terminal 718 and the VSS node. The diode 706 in each stage 700 is connected between an input terminal 720 and the central terminal 716. More specifically, the anode of the diode 706 is connected to the output terminal 718 in the prior stage 700 (except for the first stage 700(1) where the anode of diode 720 is connected directly to the VSS node), and the cathode of the diode 706 is connected to the central terminal 716. The diode 708 in each stage 700 is connected between the central terminal 716 and the output terminal 718, which connects to the following or adjacent stage 700 (except for the last stage 700(N) where the cathode of diode 708 is connected directly to a gate of a switch 722). More specifically, the anode of the diode 708 is connected to the central terminal 716, and the cathode of the diode 708 is connected to the output terminal 718. The diode 710 in each stage 700 is connected between the output terminal 718 and the EOUT node 704. More specifically, the anode of the diode 710 is connected to the output terminal 718, and the cathode of the diode 710 is connected to the EOUT node 704.

Figure 8:
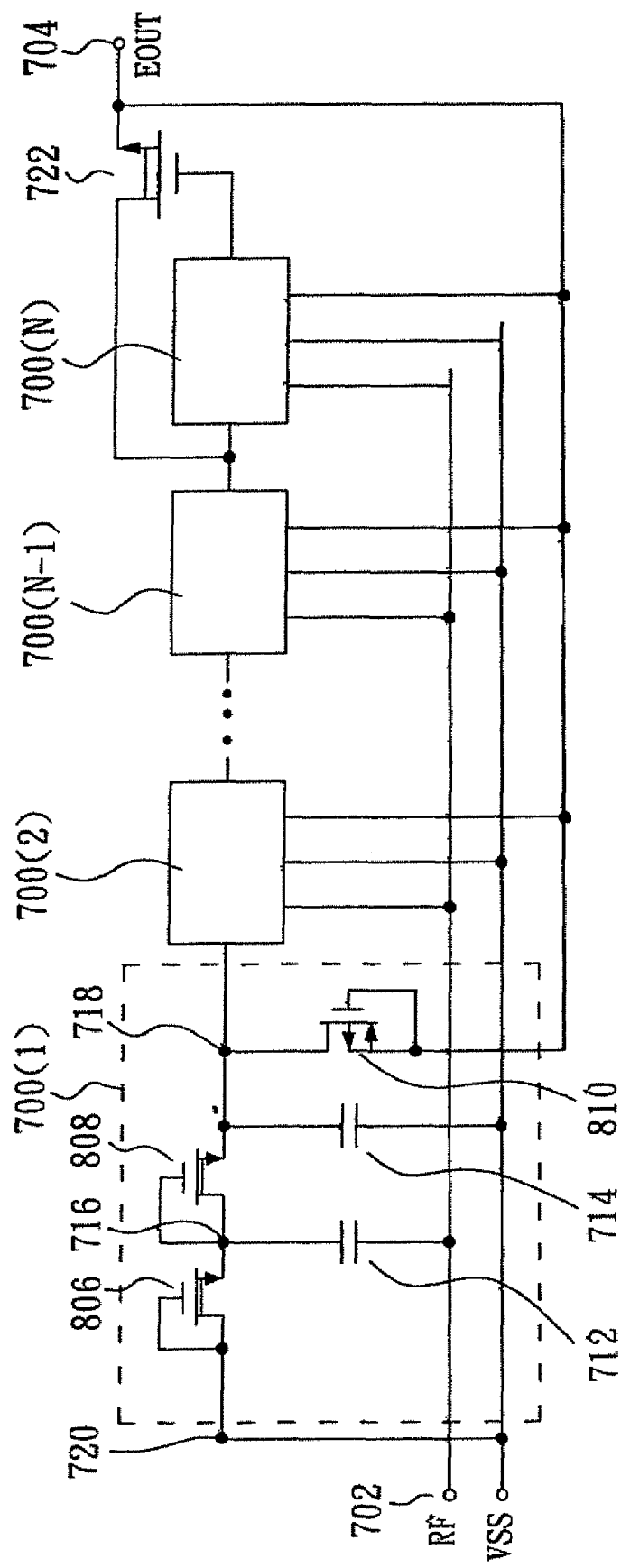
FIG. 8 depicts another circuit diagram of the demodulator 114 or 116 in accordance with the present invention.

As shown in FIG. 8, the diodes 706-708 can be implemented by using diode-connected MOSFET devices 806-808 that approximate the operation of a diode. The diode 710 can be implemented by the p/n junction of a p-channel MOS transistor 810 for better clamping while n-well/p-sub manufacturing process is utilized. For the purpose of conducting at a lower RF signal level, the diode-connected MOSFET devices 806 and 808 for implementing the diodes 706 and 708 can be provided with low threshold voltages |VT|<0.2V so as to increase the conductivity of the configured diode structures. The low threshold transistors 406 and 408 can simplify the circuit design and make the RFID chip capable of generating sufficient power with low voltage RF inputs at 150 uW peak. In addition, the capacitors 712 and 714 can be implemented by means of metal-insulator-metal (MIM) capacitors with low parasitic bottom plate to reduce capacitance seen by the RF input node 702, where Cp (parasitic bottom plate capacitance)<0.04 Crf (capacitance of MIM capacitor 714).

The operation of the demodulator 114/116 of FIG. 7 is as follows. The RF signal is simultaneously applied to each stage 700 through the capacitor 712. During a positive cycle of the RF signal, the capacitor 712 in each stage 700 transfers charge to the central terminal 716. The diode 708 is forward biased by the charge on the central terminal 716, causing the diode 708 to conduct and transfer the charge from the central terminal 716 to the output terminal 718. The charge on the output terminal 718 is stored on the capacitor 714 until the next positive RF cycle. The diode 706 is reversed biased during the positive cycle and therefore does not conduct any charge. During the negative cycle of the RF signal, the diode 706 is forward biased and conducts charge from the output terminal 720 in one stage 700 to the central terminal 716 in an adjacent stage 700 (except for the first stage 700(1) which also transfers charge from VSS node to the central terminal 716). The diodes 708 are reversed biased and do not conduct any charge. During the next positive cycle, the diode 708 is again forward biased, moving charge from the central terminal 716 to the output terminal 718 within each stage. The charge that is moved from the central terminal 716 to the output terminal 718 includes both the charge accumulated on the central terminal 716 during the positive cycle, but also the charge accumulated on the central terminal 716 from the negative cycle. Over multiple cycles of the RF signal, charge accumulates and increases as moves it through the stages 700(1)-700(N), and the corresponding voltage is added in-series at the capacitors 714. The accumulated charge at the output terminals 718 of the stages 700(N-1) and 700(N) is converted to a DC voltage $V_{DD}$ by their capacitors 714.

Moreover, the present invention uses the diode 710 in each stage 700 connected between the output terminal 718 and the EOUT node 704 to keep charge pump voltage from exceeding reliability limitations of MOSFET transistors 806 and 808 when RF input power is too high. As an example, if the voltage at the output terminal 718 exceeds that at the EOUT node 704 by around 0.6V, the current will flow from the output terminal 718 to the EOUT node 704 for preventing the capacitor 714 from charging to a voltage which is too high for the diode-connected transistor 408. Moreover, the present invention uses the switch 722 for final stage output to prevent charge on the EOUT node 704 from draining back out in reverse when one charge pump is relatively weaker than the other charge pump when the RF input energy is relatively low. The switch 722 can be implemented by means an n-channel MOS transistor with a low threshold voltage. The n-channel MOS transistor 722 is configured with a drain connected to the output terminal 718 of the stage 700(N-1), a gate connected to the output terminal 718 of the stage 700(N), and a source connected to the EOUT node 704.

Though the topology circuits of the RF-DC converter 104/106 as shown in FIG. 3 and the demodulator 114/116 are similar, the MOS transistors and the capacitors of the former are mostly sized greater than those of the latter by approximately one order For example, the MOS transistors 406 and 408 may have an aspect ratio W/L of 10 um/0.6 um while the MOS transistors 806 and 808 has an aspect ratio W/L of 1 um/0.6 um; moreover, the capacitors 312 ands 314 may have a capacitance of about 1 pF while the capacitors 712 and 714 has a capacitance of about 0.1 pF. As such, the demodulators 114 and 116 can follow rapid changes in the incoming RF signals RF1 and RF2.

Current-Mode Data Detector and Level Control Circuit

Figure 9:
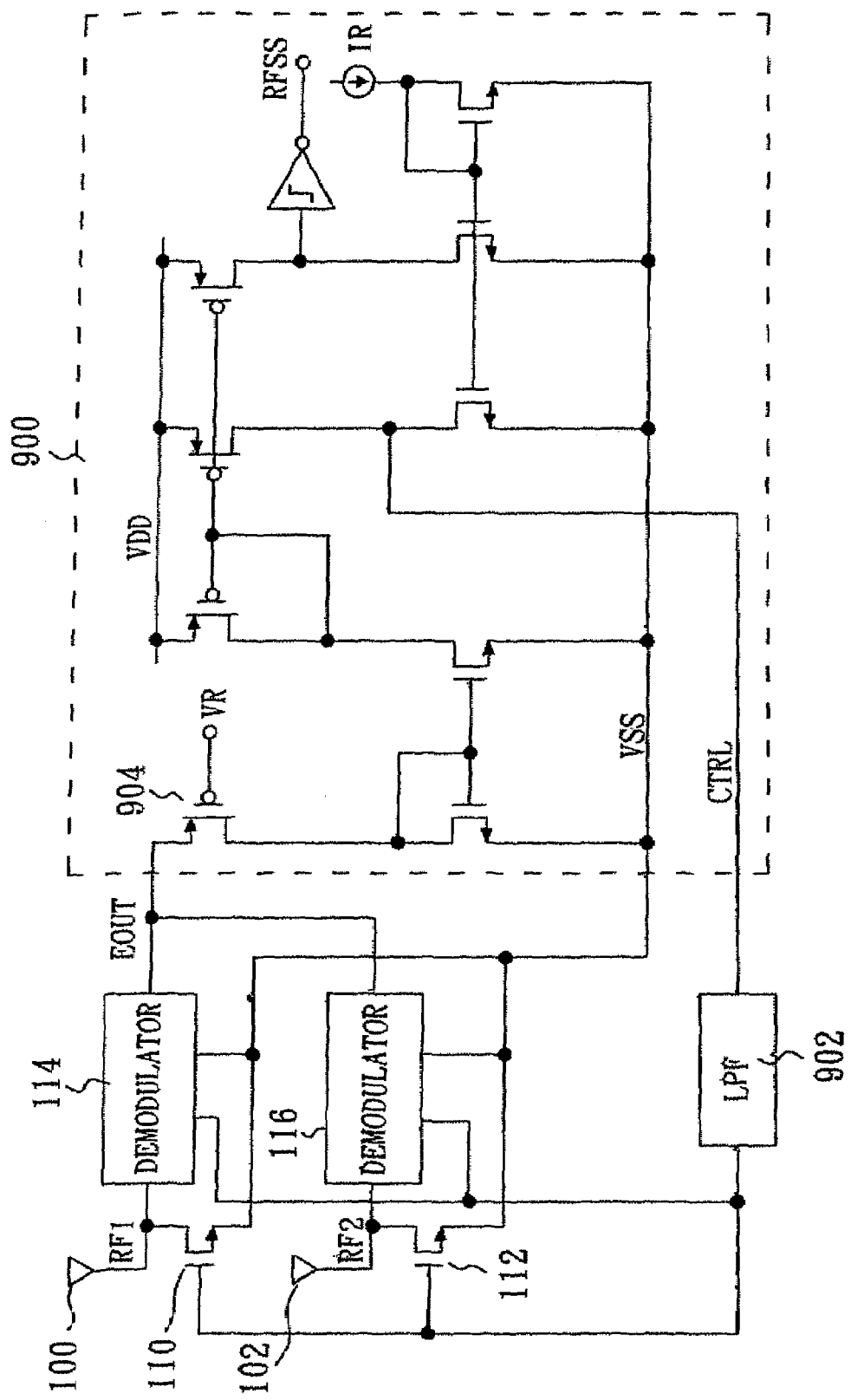
FIG. 9 depicts a detailed circuit diagram of the current-mode detector 900.

The AM data detector 118 of FIG. 6 provides no direct power feedback so that burst noise may be a concern. Accordingly, the AM data detector 118 can be replaced by a current-mode detector 900 and a low pass filter 902 to solve this problem. The detailed circuit of the current-mode detector 900 is illustrated in FIG. 9. The current mode detector 900 is provided with a p-channel MOS transistor 904 to convert the demodulator output EOUT into a current source in response to a reference voltage VR. As such, since the demodulator output EOUT is fixed to about (VR+Vgs) by the transistor 904, then current output is proportional to input power such that the demodulated signal can be generated at RFSS node. Moreover, a control signal CTRL is generated by the current-mode data detector 900 and forwarded to the low pass filter 902. The output of the low pass filter 902 is applied to control the shunt elements 110 and 112. The shunt elements 110 and 112 are turned on in response to the control signal CTRL for attenuating the incoming RF signals RF1 and RF2, thus forming a current-mode feedback loop for demodulators 114 and 116. The current-mode feedback is more amenable to low power chip implementation. No operational amplifier is necessary and very low current is possible, in preferred embodiment, only a few 10's of nano-amps are required.

Although the description above contains much specificity, it should not be construed as limiting the scope of the invention but as merely providing illustrations of some of the presently preferred embodiments of the present invention. Thus, the scope of the present invention should be determined by the appended claims and their equivalents, rather than by the examples given.

What is claimed is:

1. A radio data recovery circuit, comprising:
    a first antenna with a first orientation for receiving an RF signal;
    a second antenna with a second orientation for receiving said RF signal;
    a first demodulator coupled to said first antenna for converting said RF signal to a first voltage signal; and
    a second demodulator coupled to said second antenna for converting said RF signal to a second voltage signal,
    wherein the larger one of said first voltage signal and said second voltage signal is coupled to an output node.

2. The radio data recovery circuit as claimed in claim 1, further comprising:
    a current-mode data detector for converting the voltage signal upon said output node into a current signal such that a demodulated signal can be generated.

3. The radio data recovery circuit as claimed in claim 1, wherein said first antenna and said second antenna are orthogonally arranged.

4. A radio frequency identification (RFID) semiconductor chip, comprising:
    a first pad for connecting a first antenna for receiving an RF signal;
    a second pad for connecting a second antenna for receiving said RF signal;
    a first demodulator coupled to said first pad for converting said RF signal to a first voltage signal; and
    a second demodulator coupled to said second pad for converting said RF signal to a second voltage signal,
    wherein the larger one of said first voltage signal and said second voltage signal is coupled to an output node.

5. The RFID semiconductor chip as claimed in claim 4, further comprising a current-mode data detector for converting the voltage signal upon said output node into a current signal such that a demodulated signal can be generated.

6. The RFID semiconductor chip as claimed in claim 4, wherein said first pad and said second pad are arranged for connecting said first antenna and said second antenna, respectively, which have different orientations.

* * * * *